United States Patent
Hou et al.

(10) Patent No.: US 8,836,038 B2
(45) Date of Patent: Sep. 16, 2014

(54) CMOS DUAL METAL GATE SEMICONDUCTOR DEVICE

(75) Inventors: Yong-Tian Hou, Singapore (SG); Peng-Fu Hsu, Hsin-Chu (TW); Jin Ying, Singapore (SG); Kang-Cheng Lin, Yonghe (TW); Kuo-Tai Huang, Hsin-Chu (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1035 days.

(21) Appl. No.: 12/883,241

(22) Filed: Sep. 16, 2010

(65) Prior Publication Data

US 2011/0001194 A1    Jan. 6, 2011

Related U.S. Application Data

(62) Division of application No. 11/656,711, filed on Jan. 23, 2007, now Pat. No. 7,812,414.

(51) Int. Cl.
*H01L 29/78* (2006.01)
*H01L 21/8238* (2006.01)
*H01L 21/28* (2006.01)
*H01L 29/66* (2006.01)

(52) U.S. Cl.
CPC ...... *H01L 21/823842* (2013.01); *H01L 21/823835* (2013.01); *H01L 29/7833* (2013.01); *H01L 21/28088* (2013.01); *H01L 29/6656* (2013.01); *H01L 21/28044* (2013.01); *H01L 29/66545* (2013.01); *H01L 29/7843* (2013.01)
USPC ............................ 257/369; 257/288; 257/338

(58) Field of Classification Search
CPC ............ H01L 29/78; H01L 21/823842; H01L 21/28035; H01L 21/2807; H01L 21/28079; H01L 21/28088; H01L 21/28097
USPC ......... 257/288, 338, 350, 351, 368, 369, 371, 257/412
See application file for complete search history.

(56) References Cited

U.S. PATENT DOCUMENTS

| 4,974,056 A | 11/1990 | Brodsky et al. |
|---|---|---|
| 6,089,695 A | 7/2000 | Takagi et al. |

(Continued)

FOREIGN PATENT DOCUMENTS

| CN | 1667808 A | 9/2005 |
|---|---|---|
| CN | 1274018 C | 9/2006 |

OTHER PUBLICATIONS

Hou, Y. T., et al., "High Performance Tantalum Carbide Metal Gate Stacks for nMOSFET Application," IEEE, 2005, 4 pages.

(Continued)

*Primary Examiner* — Jerome Jackson, Jr.
*Assistant Examiner* — Paul Budd
(74) *Attorney, Agent, or Firm* — Slater and Matsil, L.L.P.

(57) ABSTRACT

A semiconductor structure and methods for forming the same are provided. The semiconductor structure includes a first MOS device of a first conductivity type and a second MOS device of a second conductivity type opposite the first conductivity type. The first MOS device includes a first gate dielectric on a semiconductor substrate; a first metal-containing gate electrode layer over the first gate dielectric; and a silicide layer over the first metal-containing gate electrode layer. The second MOS device includes a second gate dielectric on the semiconductor substrate; a second metal-containing gate electrode layer over the second gate dielectric; and a contact etch stop layer having a portion over the second metal-containing gate electrode layer, wherein a region between the portion of the contact etch stop layer and the second metal-containing gate electrode layer is substantially free from silicon.

19 Claims, 13 Drawing Sheets

(56) References Cited

U.S. PATENT DOCUMENTS

| | | |
|---|---|---|
| 6,323,115 B1 | 11/2001 | Tanabe et al. |
| 6,373,111 B1 | 4/2002 | Zheng et al. |
| 6,696,345 B2 | 2/2004 | Chau et al. |
| 6,727,129 B1 | 4/2004 | Nakajima |
| 6,794,234 B2 | 9/2004 | Polishchuk et al. |
| 6,831,310 B1 | 12/2004 | Mathew et al. |
| 6,855,641 B2 | 2/2005 | Ryu et al. |
| 6,936,508 B2 | 8/2005 | Visokay et al. |
| 6,998,686 B2 | 2/2006 | Chau et al. |
| 7,157,378 B2 | 1/2007 | Brask et al. |
| 7,160,767 B2 | 1/2007 | Brask et al. |
| 7,253,053 B2 | 8/2007 | Eppich et al. |
| 7,432,567 B2 | 10/2008 | Doris et al. |
| 2002/0079548 A1 | 6/2002 | Hu |
| 2003/0057499 A1 | 3/2003 | Yamamoto |
| 2003/0128384 A1 | 7/2003 | Nelson et al. |
| 2004/0066535 A1 | 4/2004 | Oyumi |
| 2004/0245578 A1 | 12/2004 | Park et al. |
| 2004/0256679 A1 | 12/2004 | Hu |
| 2005/0082605 A1 | 4/2005 | Akasaka |
| 2005/0112875 A1 | 5/2005 | Lander et al. |
| 2005/0157138 A1 | 7/2005 | Silverbrook et al. |
| 2005/0258500 A1* | 11/2005 | Colombo et al. ............ 257/412 |
| 2005/0260806 A1 | 11/2005 | Chang et al. |
| 2005/0285208 A1* | 12/2005 | Ren et al. ................ 257/388 |
| 2006/0033165 A1* | 2/2006 | Chan et al. ................ 257/368 |
| 2006/0121678 A1 | 6/2006 | Brask et al. |
| 2006/0166424 A1 | 7/2006 | Schaeffer, III et al. |
| 2007/0018244 A1 | 1/2007 | Hung et al. |
| 2007/0075351 A1 | 4/2007 | Schulz et al. |
| 2007/0105317 A1 | 5/2007 | Nakajima |
| 2007/0138559 A1 | 6/2007 | Bohr |
| 2007/0145493 A1* | 6/2007 | Koyama et al. ............... 257/385 |
| 2007/0272975 A1 | 11/2007 | Schaeffer et al. |
| 2008/0099851 A1 | 5/2008 | Hsu et al. |
| 2008/0173947 A1 | 7/2008 | Hou et al. |
| 2008/0188044 A1 | 8/2008 | Hsu et al. |
| 2009/0039433 A1 | 2/2009 | Yang et al. |
| 2009/0152636 A1 | 6/2009 | Chudzik et al. |

OTHER PUBLICATIONS

Hsu, P. F., et al., "Advanced Dual Metal Gate MOSFETs with High-$k$ Dielectric for CMOS Application," Symposium on VLSI Technology Digest of Technical Papers, IEEE, 2006, 2 pages.

Chudzik, M., et al., "High-Performance High-k/Metal Gates for 45nm CMOS and Beyond with Gate-First Processing," Symposium on VLSI Technology Digest of Technical Papers, 2007, pp. 194-195.

Tateshita, Y., et al., "High-Performance and Low-Power CMOS Device Technologies Featuring Metal/High-k Gate Stacks with Uniaxial Strained Silicon Channels on (100) and (110) Substrates," IEEE International Electron Devices Meeting, 2006, 4 pages, IEEE.

* cited by examiner

CMOS DUAL METAL GATE SEMICONDUCTOR DEVICE

CROSS REFERENCES

This application is a divisional of patent application Ser. No. 11/656,711, entitled "Hybrid Process for Forming Metal Gates," filed on Jan. 23, 2007, which application is incorporated herein by reference.

TECHNICAL FIELD

This invention relates generally to semiconductor devices, and more particularly to structures of metal-oxide-semiconductor (MOS) devices and manufacturing methods for forming the same.

BACKGROUND

Metal-oxide-semiconductor (MOS) devices are basic building elements in integrated circuits. A conventional MOS device typically has a gate electrode comprising polysilicon doped with p-type or n-type impurities, using doping operations such as ion implantation or thermal diffusion. It is preferred to adjust the work function of the gate electrode to the band-edge of the silicon; that is, for an NMOS device, adjusting the work function close to the conduction band, and for a PMOS device, adjusting the work function close to the valence band. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when applied electrical fields sweep away carriers from regions close to gate dielectrics, forming depletion layers. In an n-doped polysilicon layer, the depletion layer includes ionized non-mobile donor sites, whereas in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The use of thin gate dielectrics tends to make the carrier depletion effect worse. With thin gate dielectrics, the depletion layer in the polysilicon gate becomes more significant in thickness when compared to the thickness of the thin gate dielectrics, and thus device performance degradation worsens. As a result, the carrier depletion effect in the gate electrodes limits device scalability by imposing a lower bound on how much the effective gate dielectric thickness can be reduced.

The poly depletion effect was previously solved by forming metal gate electrodes or metal silicide gate electrodes, wherein the metallic gates used in NMOS devices and PMOS devices also preferably have band-edge work functions. Currently, materials suitable for forming gate electrodes of NMOS devices, such as TaC, have been found. However, for PMOS devices, even though metallic materials having band-edge work functions have been found, these materials have poor thermal stability. When exposed to the high temperatures in the front-end-of-line processes, the work functions of these metallic materials shift, for example, toward the mid-gap level. The performance of the resulting PMOS devices is thus adversely affected.

Existing processes for forming dual-metal complementary MOS (CMOS) devices include two main categories, gate-first approach and gate-last approach. Both approaches have advantageous and disadvantageous features. In a typical gate-first approach, two metal layers having different work functions are separately formed in PMOS and NMOS regions. The metal layers are then patterned to form gate electrodes. Other components of MOS devices, such as spacers, lightly doped source/drain (LDD) regions, source/drain regions, silicides and contact etch stop layers are then formed. This process is relatively simple, and the resulting contact etch stop layers are continuous, so that they can effectively apply stresses. However, since the metal gates are formed before the formation and the activation of LDD regions and source/drain regions, they suffer from high thermal budgets, and the work functions of PMOS devices may shift. In addition, patterning metal layers by etching is relatively difficult.

Gate-last approach, on the other hand, typically includes the steps of forming dummy gates for both PMOS and NMOS devices. LDD regions, gate spacers, source/drain regions and contact etch stop layers are then formed. The dummy gates of PMOS and NMOS devices are then removed, and metals with different work functions are then filled into the openings for PMOS and NMOS devices. In the gate-last approach, metal gates of PMOS devices and NMOS devices both take the advantage of low thermal budgets since they are formed after the formation and activation of LDD regions and source/drain regions. However, the process is complex. In addition, during the step of removing the dummy gates, the portions of contact etch stop layer on the gates are also removed. This results in the significant degradation in the contact etch stop layers' ability of applying stresses.

Accordingly, what is needed in the art is a semiconductor structure and respective formation methods that may incorporate dual metal gates thereof to take advantage of the benefits associated with band-edge work functions while at the same time overcoming the deficiencies of the prior art.

SUMMARY OF THE INVENTION

In accordance with one aspect of the present invention, a semiconductor structure includes a first MOS device of a first conductivity type and a second MOS device of a second conductivity type opposite the first conductivity type. The first MOS device includes a first gate dielectric on a semiconductor substrate; a first metal-containing gate electrode layer over the first gate dielectric; and a silicide layer over the first metal-containing gate electrode layer. The second MOS device includes a second gate dielectric on the semiconductor substrate; a second metal-containing gate electrode layer over the second gate dielectric; and a contact etch stop layer having a portion over the second metal-containing gate electrode layer, wherein a region between the portion of the contact etch stop layer and the second metal-containing gate electrode layer is substantially free from silicon.

In accordance with another aspect of the present invention, a semiconductor structure includes an NMOS device and a PMOS device. The NMOS device includes a first gate dielectric on a semiconductor substrate; a first metal-containing gate electrode layer over the first gate dielectric; a polysilicon layer over the first metal-containing gate electrode layer; a silicide region on the polysilicon layer; and a first contact etch stop layer having a portion on the silicide layer and physically contacting the silicide region. The PMOS device includes a second gate dielectric on the semiconductor substrate; a second metal-containing gate electrode layer over the second gate dielectric, wherein the first metal-containing gate electrode layer has a first work function different from a second work function of the second metal-containing gate electrode layer; and a second contact etch stop layer having a portion on the second metal-containing gate electrode layer and physically contacting the second metal-containing gate electrode layer.

In accordance with yet another aspect of the present invention, a semiconductor structure includes a semiconductor substrate and a first MOS device, and a second MOS device. The first MOS device is of a first conductivity type and comprises a first gate dielectric on the semiconductor substrate; a first metal-containing gate electrode layer over the first gate dielectric; a first etch stop layer having a first portion over the first metal-containing gate electrode layer; and a first region between the first portion of the first contact etch stop layer and the first metal-containing gate electrode layer. The second MOS device is of a second conductivity type opposite the first conductivity type and comprises a second gate dielectric on the semiconductor substrate; a second metal-containing gate electrode layer over the second gate dielectric; a second contact etch stop layer having a second portion over the second metal-containing gate electrode layer, and a second region between the second metal-containing gate electrode layer and the second portion of the second contact etch stop layer, wherein the first region comprises more silicon than the second region.

In accordance with yet another aspect of the present invention, a method for forming a semiconductor structure includes forming an NMOS device and a PMOS device. The step of forming the NMOS device includes forming a first gate dielectric on the semiconductor substrate; forming a first metal-containing gate electrode layer over the first gate dielectric; and forming a polysilicon layer over the first metal-containing gate electrode layer. The step of forming the PMOS device includes forming a second gate dielectric on the semiconductor substrate; forming a second metal-containing gate electrode layer over the second gate dielectric; and forming a contact etch stop layer having a portion directly over the second metal-containing gate electrode layer, wherein a region between the portion of the contact etch stop layer and the second metal-containing gate electrode layer is free from silicon.

In accordance with yet another aspect of the present invention, a method for forming a semiconductor structure includes providing a semiconductor substrate comprising an NMOS region and a PMOS region; forming a gate dielectric layer on the semiconductor substrate; forming a metal-containing layer on the gate dielectric layer; and patterning the metal-containing layer and the gate dielectric layer to form a first gate dielectric and a first gate electrode in the NMOS region, respectively, and a second gate dielectric and a dummy gate electrode in the PMOS region, respectively. The method further includes forming a first gate spacer on a sidewall of the first gate electrode; forming a first source/drain region adjacent the first gate dielectric; forming a second gate spacer on a sidewall of the second gate electrode; forming a second source/drain region adjacent the second gate dielectric; removing the dummy gate electrode; filling an opening left by the dummy gate electrode to form a second gate electrode, wherein the second gate electrode comprises a metal; forming a first contact etch stop layer over the first gate electrode; and forming a second contact etch stop layer over the second gate electrode.

The hybrid method of the present invention prevents the work function shift of PMOS devices. In the meanwhile, the manufacturing cost is not increased, and the stresses applied by the etch stop layers are not degraded.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A hybrid method for forming complementary metal-oxide-semiconductor (CMOS) devices with dual metal gates is provided. The hybrid method combines gate-first and gate-last approaches to achieve better effects. The intermediate stages of manufacturing a preferred embodiment of the present invention are illustrated. Throughout the various views and illustrative embodiments of the present invention, like reference numbers are used to designate like elements.

Figure 1:
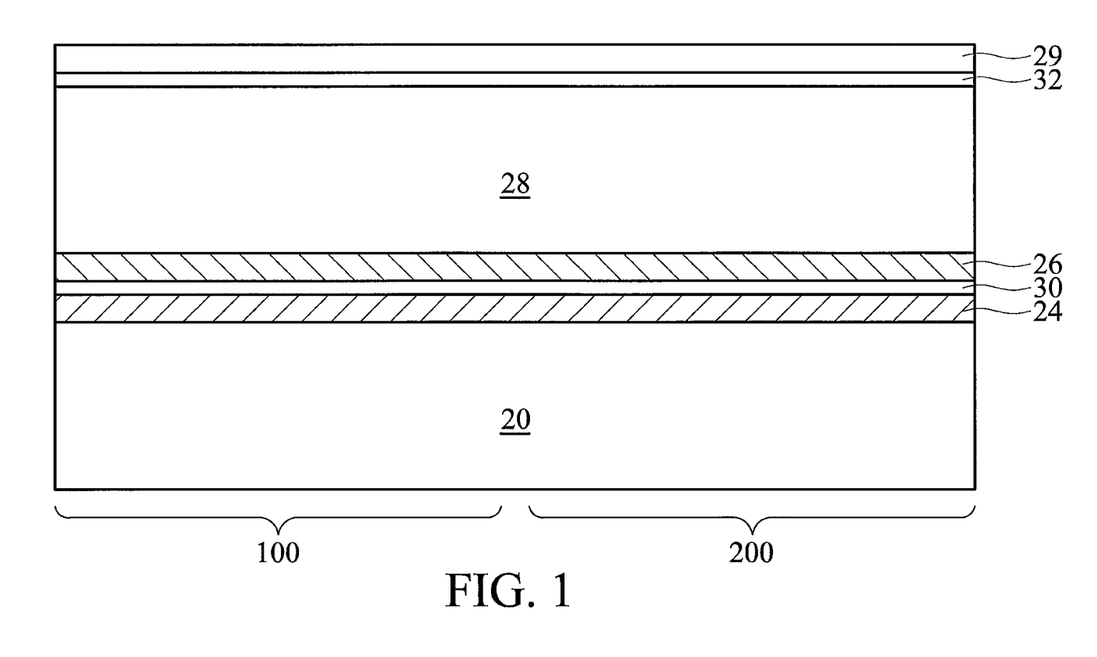
FIGS. 1 through 13 are cross-sectional views of intermediate stages in the manufacturing of an embodiment of the present invention.

Referring to FIG. 1, substrate 20 is provided, which may be formed of commonly used semiconductor materials and structures such as bulk silicon, silicon-on-insulator (SOI), silicon-germanium (SiGe), embedded SiGe (eSiGe), germanium, and the like. Shallow trench isolation regions (not shown) are formed in substrate 20, which define NMOS device region 100 and PMOS device region 200. Gate dielectric layer 24, metal layer 26, polysilicon layer 28, and mask layer 29 are then sequentially formed on substrate 20. In an embodiment, gate dielectric layer 24 is formed of silicon oxide. In other embodiments, gate dielectric layer 24 comprises materials having high dielectric constants (high-k). The exemplary high-k materials include metal oxides such as $HfO_2$, $ZrO_2$, silicate HfSiON, metal alloy oxides such as HfZrO, HfTaO, HfTiO, HfAlO, and combinations thereof. In an exemplary embodiment, a thickness of gate dielectric layer 24 is between about 1 nm and about 10 nm. One skilled in the art will realize, however, that the thickness and other dimensions recited throughout the description are related to the scale of the formation technology of the integrated circuit.

Metal layer 26 preferably has a work function suitable for forming NMOS devices, and the work function is preferably between about 4.0 eV and about 4.4 eV, and more preferably close to the band-edge work function of about 4.1 eV. The exemplary materials include tantalum-containing materials such as TaC, TaN, TaSiN, and combinations thereof. Metal layer 26 may have a thickness of between about 1 nm and 30 nm. The formation methods of gate dielectric layer 24 and metal layer 26 include atomic layer deposition (ALD), physical vapor deposition (PVD), metal-organic chemical vapor deposition (MOCVD), and the like.

Polysilicon layer 28 may have a thickness of between about 30 nm and about 100 nm. The functions of polysilicon layer 28 include preventing contamination of metal layer 26, and maintaining the height of the gate stack to a level convenient for the existing processes. Mask layer 29 is preferably formed of dielectric materials, such as silicon nitride, silicon oxynitride, silicon carbide, and the like.

In alternative embodiments, adhesion layer 30 and/or cap layer 32 may be formed on and below metal layer 26, respectively. Preferably, adhesion layer 30 is used to improve the adhesion between gate dielectric layer 24 and metal layer 26, and may further prevent the interaction and/or reaction between gate dielectric layer 24 and metal layer 26. Cap layer 32 is used to prevent the oxidation of metal layer 26. Adhesion layer 30 and cap layer 32 each may comprise TiN, TaSiN, and combinations thereof. The thickness of each of the adhesion layer 30 and cap layer 32 is preferably between about 1 nm and about 10 nm. If formed, adhesion layer 30 and cap layer 32 will remain in the final NMOS device. For simplicity, they are not shown in subsequent drawings.

Figure 2:
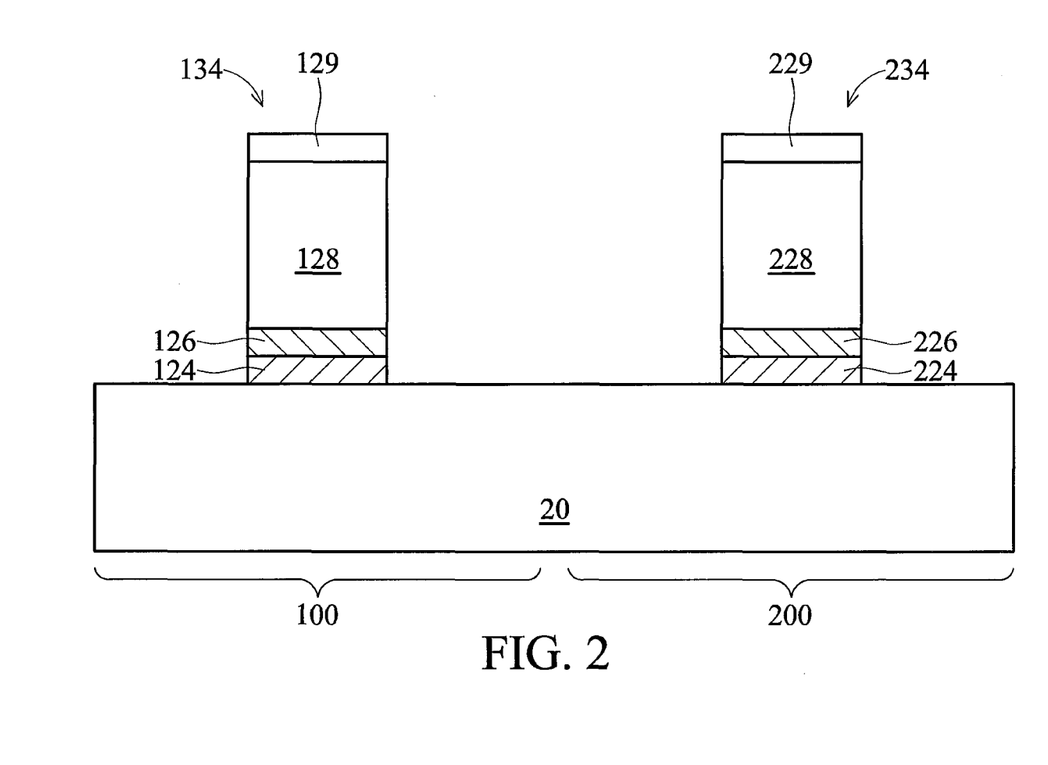

FIG. 2 illustrates the patterning of the previously formed stacked layers, forming gate stack 134 in NMOS region 100 and gate stack 234 in PMOS region 200. Gate stack 134 includes gate dielectric 124, metal layer 126, polysilicon layer 128 and mask layer 129. Gate stack 234 includes gate dielectric 224, metal layer 226, polysilicon layer 228 and mask layer 229. The gate electrode including layers 226 and 228 will be removed in subsequent steps, and thus is alternatively referred to as a dummy gate electrode.

Figure 3:
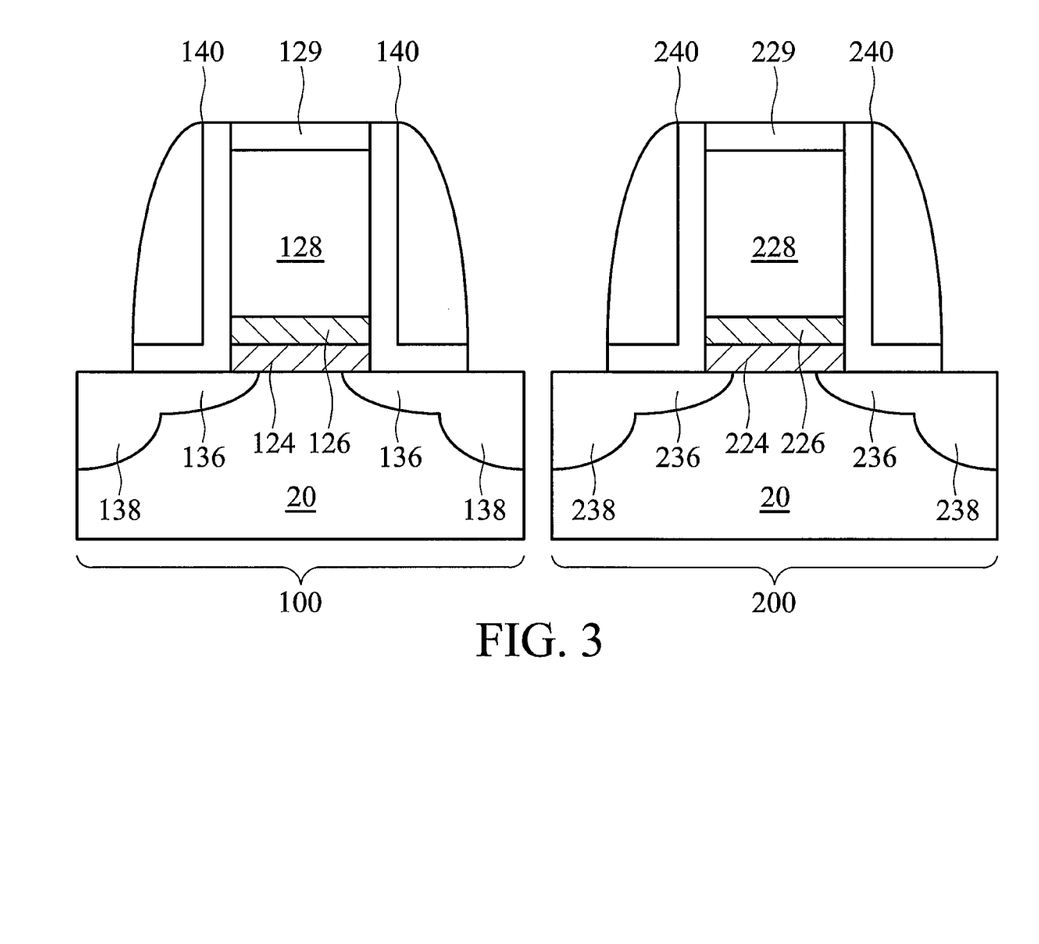
Figure 8:
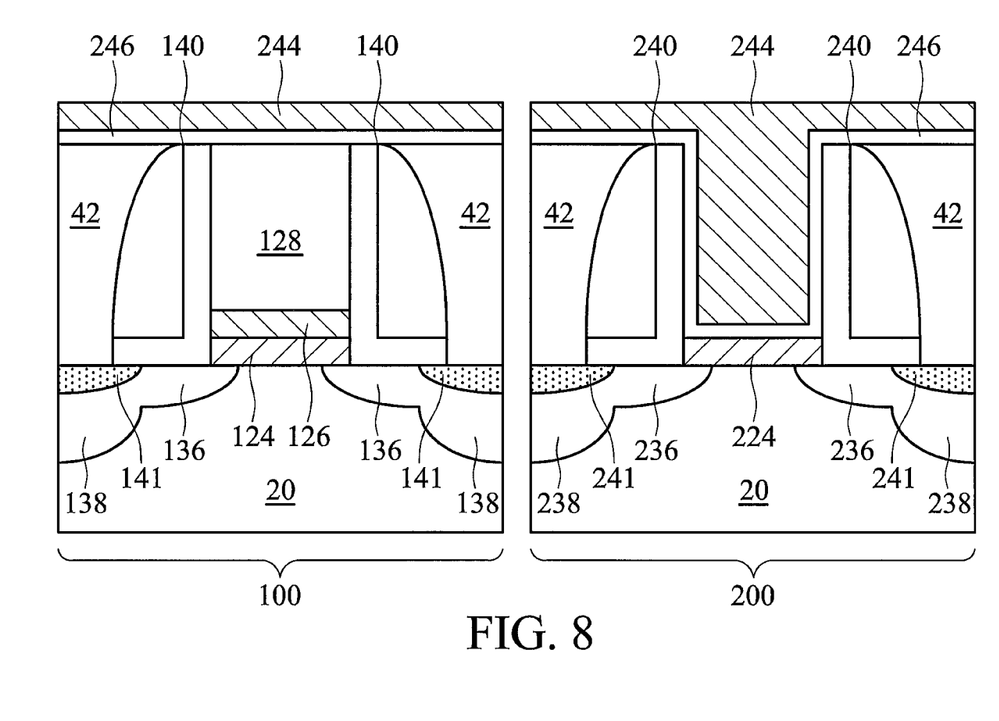

Next, as illustrated in FIG. 3, lightly doped source and drain (LDD) regions 136 are formed in NMOS region 100, preferably by implanting an n-type impurity. Similarly, LDD regions 236 are formed in PMOS region 200, preferably by implanting a p-type impurity. Masks (not shown) are formed to mask one of the NMOS region 100 and PMOS region 200 when the other region is implanted. Spacers 140 and 240 are then formed. Each of the spacers 140 and 240 may include a single layer or a composite layer including, for example, a silicon nitride layer on an oxide liner. In subsequent steps, source and/or drain regions (hereinafter referred to as source/drain regions) 138 and 238 are formed in NMOS device region 100 and PMOS device region 200, respectively. In alternative embodiments stressors (not shown) are formed to improve stresses in channel regions. In PMOS region 200, SiGe stressors (not shown) may be formed, which apply a compressive stress to the channel region of the respective PMOS device, while in NMOS region 100, SiC stressors (not shown) may be formed, which apply a tensile stress to the channel region of the respective NMOS device Anneals such as rapid thermal anneal (RTA), laser anneal, and flush anneal, are performed to activate LDD regions 136 and 236 and source/drain regions 138 and 238. In the preferred embodiment, the activation steps may be performed anytime before the formation of the metal gates for PMOS devices, which step is illustrated in FIG. 8. The details for forming LDD regions 136 and 236, gate spacers 140 and 240, and source/drain regions 138 and 238 are well known in the art, and thus are not repeated herein.

Figure 4:
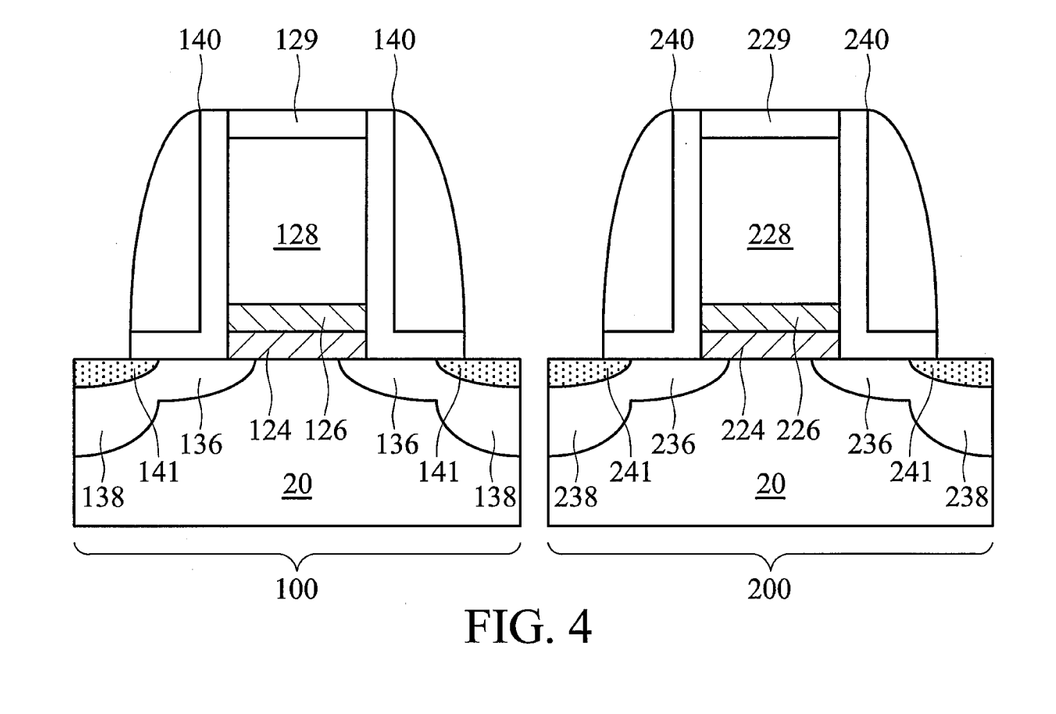

FIG. 4 illustrates the silicidation process for forming silicide regions 141 on source/drain regions 138, and silicide regions 241 on source/drain regions 238. The silicidation process may include blanket forming a metal layer, which may include nickel, platinum, palladium, titanium, cobalt, and combinations thereof, and heating the substrate, so that the silicon in source/drain regions 138 and 238 reacts with the metal where contacted, forming metal silicide regions. The un-reacted metal is selectively removed through the use of an etchant that attacks metal but does not attack silicide.

Figure 5:
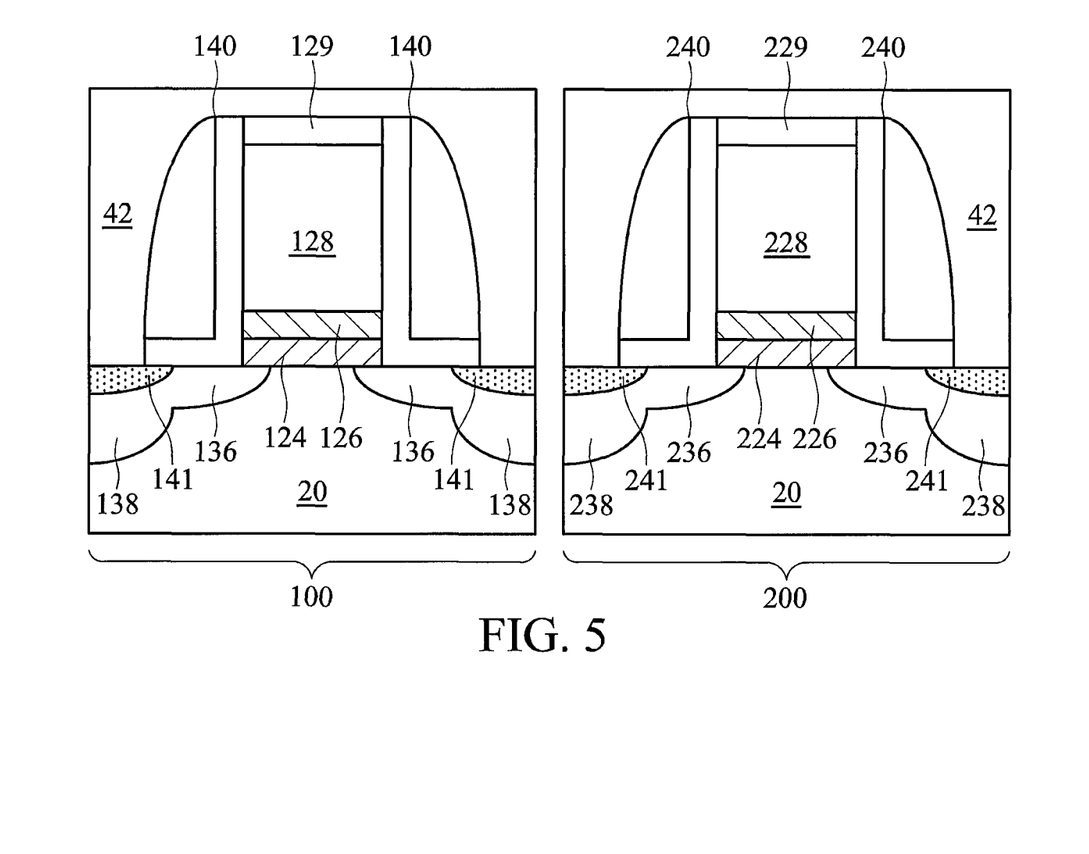

FIG. 5 illustrates the formation of coating 42, which has a top surface higher than the top surfaces of mask layers 129 and 229. In one embodiment, coating 42 includes dielectric materials, such as the materials commonly used in inter-layer dielectric (ILD), which may include carbon-containing oxides. In other embodiments, coating 42 is a photo resist layer.

Figure 6:
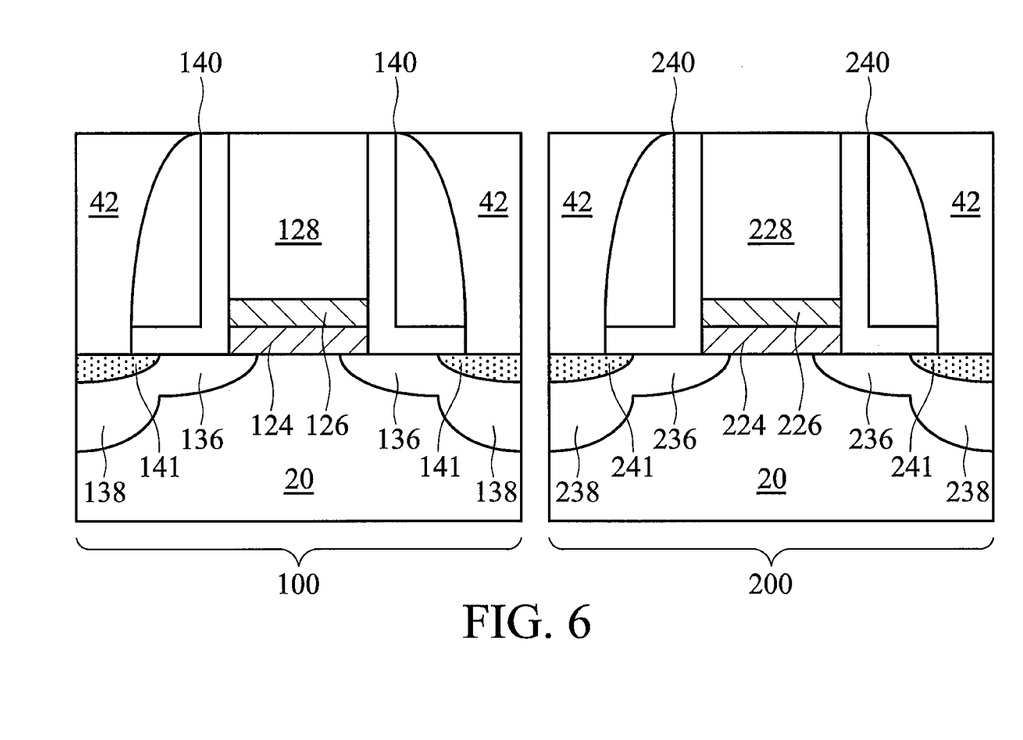

Referring to FIG. 6, a chemical mechanical polish (CMP) is performed to remove portions of coating 42, and mask layers 129 and 229, hence exposing polysilicon layers 128 and 228. In the case coating 42 is formed of photo resist, it may be either polished or etched back to expose mask layers 129 and 229.

Figure 7:
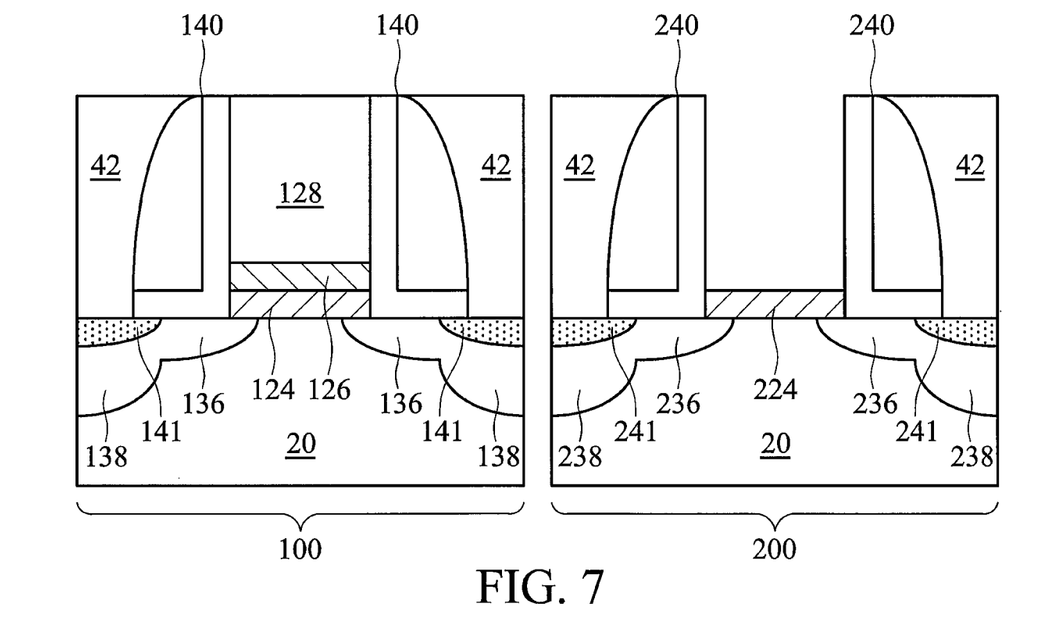

FIG. 7 illustrates the selective removal of the dummy gate including polysilicon layer 228 and metal layer 226. The removal of polysilicon layer 228 may be performed using dry etch or wet etch, while the removal of metal layer 226 preferably use wet etch in order to reduce the possible damage to the underlying gate dielectric 224. Gate dielectric 224 is thus exposed.

Referring to FIG. 8, the opening left by the dummy gate electrode is filled with a metallic material 244, which preferably has a work function suitable for forming PMOS devices. It is preferred that metallic material 244 has a low resistivity and good gap-filling capability. In an exemplary embodiment, metallic material 244 may include metal layer $244_1$ for achieving desired work function, and metal layer $244_2$ for improving gap filling. Metal layer $244_1$ preferably has a thickness of between about 1 nm and about 5 nm. Metal layer $244_2$ preferably includes material having a good gap-filling capability, such as tungsten. The preferred work function of metallic material 244 (or layer $244_2$ if metal material 244 includes more than one layer) is between about 4.9 eV and about 5.2 eV, and more preferably close to the band-edge work function of about 5.2 eV. The exemplary materials include tungsten-containing materials such as tungsten and tungsten nitride, ruthenium-containing materials such as ruthenium and ruthenium oxide, molybdenum-containing materials such as molybdenum and molybdenum nitride, and combinations thereof. Optionally, adhesion layer 246 may be formed prior to the formation of metallic material 244 to improve the adhesion between metallic material 244 and gate dielectric 224. Adhesion layer 246 may comprise TiN, TaN, TaSiN, and combinations thereof. The thickness of adhesion layer 246 is preferably between about 1 nm and about 5 nm. For simplicity, adhesion layer 246 is not shown in subsequent drawings. The formation methods of adhesion layer 246 and metallic material 244 include atomic layer deposition (ALD), physical vapor deposition (PVD), metal-organic chemical vapor deposition (MOCVD), and the like. More preferably, the formation methods are low-temperature methods in order to reduce the work function shift of the resulting gate electrode.

Figure 9:
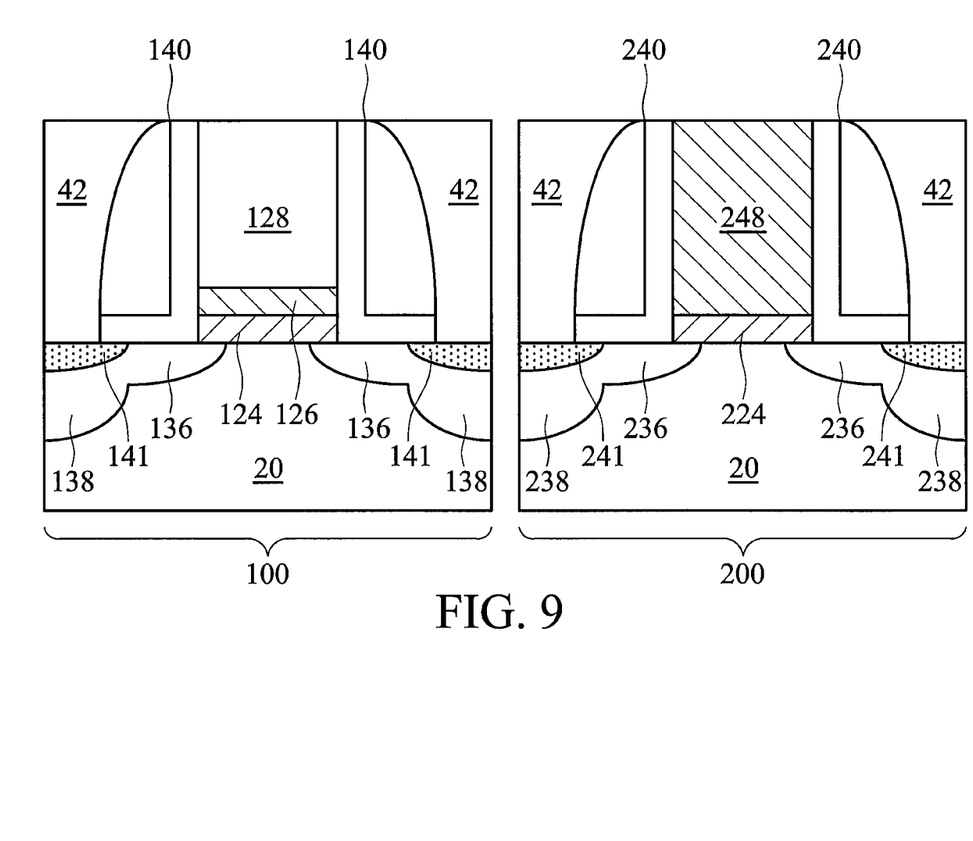

FIG. 9 illustrates the removal of excess metallic material 244, which may be performed either by a CMP process or a wet etch. Polysilicon layer 128 is also exposed. The leftover metallic material 244 forms gate electrode 248 of the resulting PMOS device.

Figure 10:
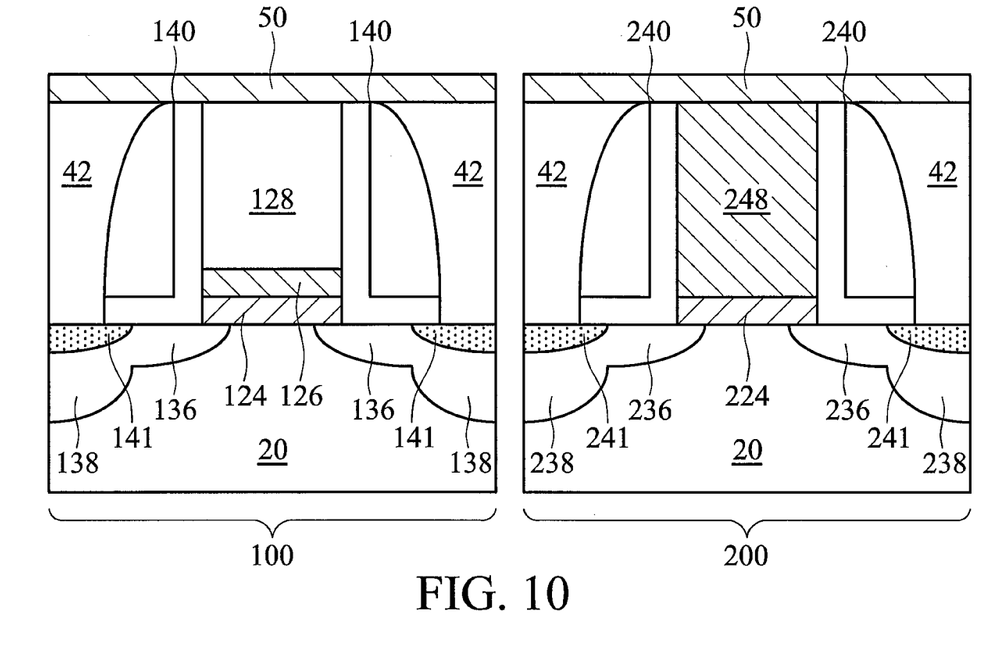
Figure 11:
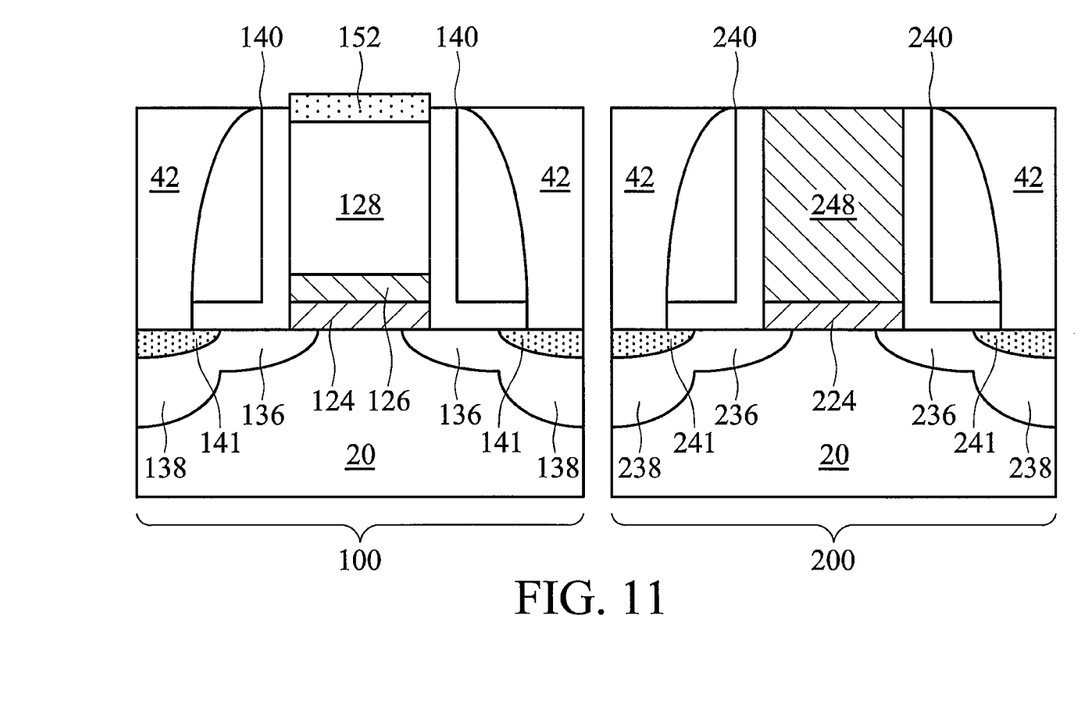

A top portion of polysilicon layer 128 is then silicided. Referring to FIG. 10, a thin metal layer 50 is blanket deposited and heated to form silicide layer 152. As is shown in FIG. 11. Un-reacted metal layer 50 is then removed. Since silicide layer 152 and source/drain silicide regions 141 and 241 are formed separately, they may include different metal silicides. For example, source/drain regions 141 and 241 may include a thermal-stable metal, and silicide layer 152 may include a metal having good resistivity roll-off characteristics.

Figure 12:
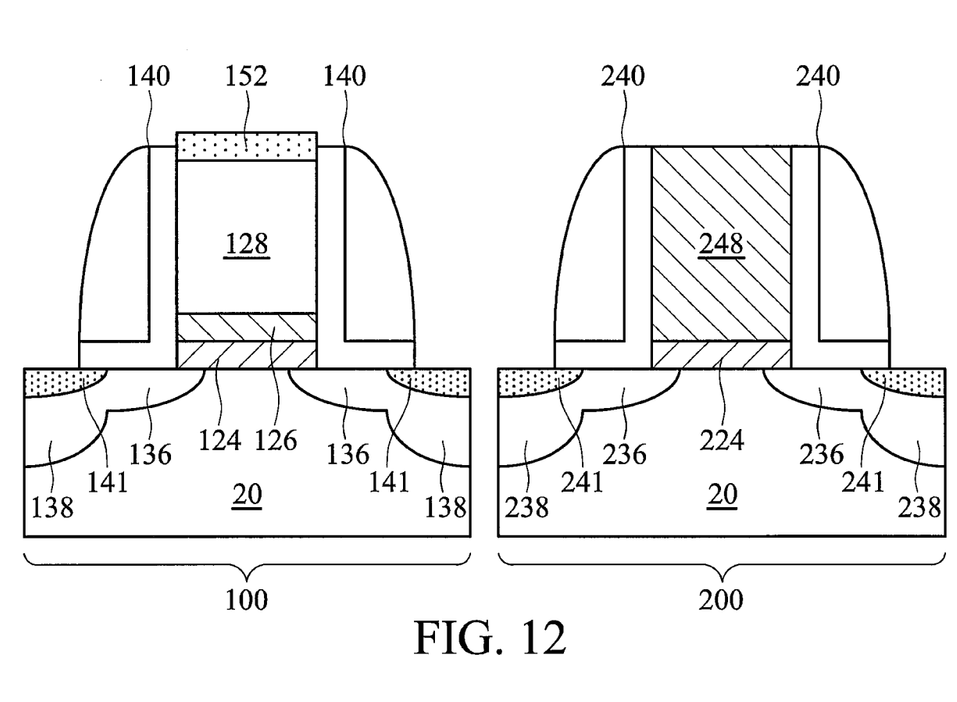
Figure 13:
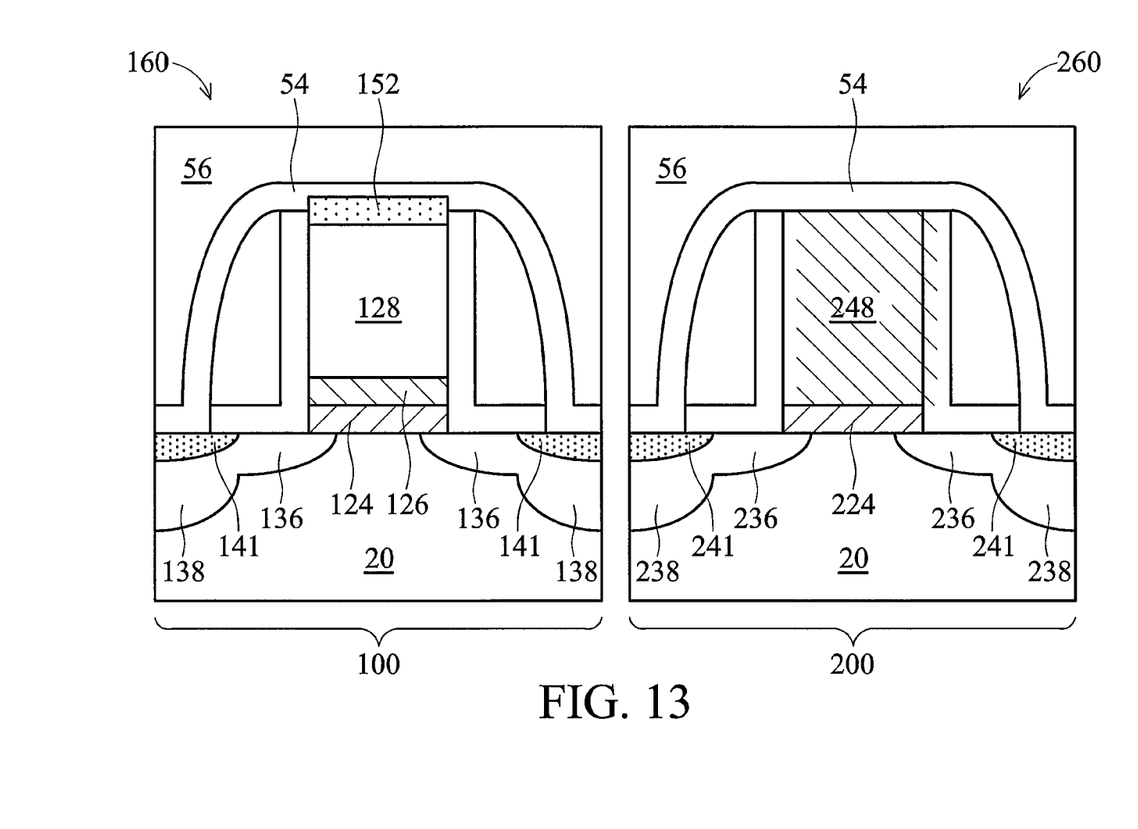

Referring to FIG. 12, coating 42 is removed. In the case coating 42 is formed of oxide, it may be removed using diluted HF. If coating 42 is formed of photo resist, standard photo resist striping process is performed. In subsequent process steps, as shown in FIG. 13, contact etch stop layer (CESL) 54 and inter-layer dielectric 56 are formed. Preferably, CESL 54 has an inherent stress. The details of CESL 54 are well known in the art, and thus are not repeated herein. One skilled in the art will realize CESL 54 may be formed of a first portion in NMOS region 100, and a second portion in PMOS region 200, and the first and second portion may have different stresses. It is appreciated that since CESL 54 is formed after the formation of gate electrodes, it includes portions directly over polysilicon layer 128 and gate electrode 248, which portions bridge the portions of CESL 54 over the respective source region and drain region for each of the NMOS device 160 and PMOS device 260. As compared to conventional gate-last approaches, greater stresses may be applied by CESL 54 to the channel regions of NMOS device 160 and PMOS device 260.

The work function of the gate electrode of NMOS device 160 is determined by the work function of metal layer 126, which comprises a different metal from gate electrode 248. Therefore, both gate electrodes of the NMOS device 160 and PMOS device 260 may have band-edge work functions, providing appropriate materials are used. In the preferred embodiments, the formation of the metal gate of NMOS device 160 uses gate-first approach, and the cost related to removing dummy gate, filling with a metal material, CMP, and the like, is saved. The formation of the metal gate of PMOS device 260 uses gate-last approach. Since gate electrode 248 is formed after the formation and the activation of LDD regions 136 and 236 and source/drain regions 138 and 238, the thermal budget applied to gate electrode 248 is low, and thus the work function shift of gate electrode 248 is reduced. The metal gate 126 of NMOS device 160, however, is relatively stable with significantly less work function shift even annealed at high temperatures.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps

What is claimed is:

1. A semiconductor structure comprising:
a semiconductor substrate;
a first MOS device of a first conductivity type, the first MOS device comprising:
 a first gate dielectric over the semiconductor substrate;
 a first metal-containing gate electrode layer over the first gate dielectric;
 a silicon-containing layer over and contacting the first metal-containing gate electrode layer; and
 a first contact etch stop layer having a first portion directly over the silicon-containing layer; and
a second MOS device of a second conductivity type opposite the first conductivity type, the second MOS device comprising:
 a second gate dielectric over the semiconductor substrate;
 a second metal-containing gate electrode layer over the second gate dielectric, wherein a top surface of the first metal-containing gate electrode layer is lower than a top surface of the second metal-containing gate electrode layer; and
 a second contact etch stop layer having a second portion directly over the second metal-containing gate electrode layer, wherein no silicon-containing layer is disposed directly over the second metal-containing gate electrode layer and under the second contact etch stop layer.

2. The semiconductor structure of claim 1, wherein the second metal-containing gate electrode layer contacts the second contact etch stop layer.

3. The semiconductor structure of claim 1, wherein the silicon-containing layer comprises a silicide layer.

4. The semiconductor structure of claim 1, wherein the first metal-containing gate electrode layer has a work function less than about 4.4 eV, and wherein the second metal-containing gate electrode layer has a work function greater than about 4.9 eV.

5. The semiconductor structure of claim 1, wherein the first metal-containing gate electrode layer comprises a material selected from the group consisting essentially of TaC, TaN, TaSiN, and combinations thereof, and wherein the second metal-containing gate electrode layer comprises a material selected from the group consisting essentially of a tungsten-containing material, a ruthenium-containing material, a molybdenum-containing material, and combinations thereof.

6. The semiconductor structure of claim 1, wherein the first MOS device is an NMOS device, and the second MOS device is a PMOS device.

7. The semiconductor structure of claim 1 further comprising:
a first gate spacer on a sidewall of the first metal-containing gate electrode layer and a sidewall of the silicon-containing layer; and
a second gate spacer on a sidewall of the second metal-containing gate electrode layer, wherein a top surface of the second metal-containing gate electrode layer is substantially level with a top edge of the second gate spacer.

8. The semiconductor structure of claim 7, wherein a top edge of the first gate spacer is substantially level with the top edge of the second gate spacer.

9. A semiconductor structure comprising:
a semiconductor substrate;
a first MOS device of a first conductivity type, the first MOS device comprising:
 a first gate dielectric over the semiconductor substrate;
 a first metal-containing gate electrode layer free from silicon therein over the first gate dielectric;
 a polysilicon layer over the first metal-containing gate electrode layer; and
 a first gate spacer on a sidewall of the first metal-containing gate electrode layer and the polysilicon layer; and
a second MOS device of a second conductivity type opposite the first conductivity type, the second MOS device comprising:
 a second gate dielectric over the semiconductor substrate;
 a second metal-containing gate electrode layer over the second gate dielectric, wherein the second metal-containing gate electrode layer comprises:
  an adhesion layer; and
  a metallic region, wherein the adhesion layer comprises a bottom portion underlying the metallic region, and a sidewall portion on a sidewall of the metallic region; and
 a second gate spacer on a sidewall of the second metal-containing gate electrode layer, wherein a top edge of the second gate spacer is substantially level with a top edge of the second metal-containing gate electrode layer.

10. The semiconductor structure of claim 9, wherein a top surface of the first metal-containing gate electrode layer is lower than a top surface of the second metal-containing gate electrode layer.

11. The semiconductor structure of claim 9, wherein the adhesion layer comprises titanium nitride.

12. The semiconductor structure of claim 9, wherein top edges of the first and the second gate spacers are level with each other.

13. The semiconductor structure of claim 9, wherein the first metal-containing gate electrode layer has a work function less than about 4.4 eV, and wherein the second metal-containing gate electrode layer has a work function greater than about 4.9 eV.

14. The semiconductor structure of claim 9, wherein the first metal-containing gate electrode layer comprises a material selected from the group consisting essentially of TaC, TaN, TaSiN, and combinations thereof, and wherein the second metal-containing gate electrode layer comprises a material selected from the group consisting essentially of a tungsten-containing material, a ruthenium-containing material, a molybdenum-containing material, and combinations thereof.

15. A semiconductor structure comprising:
a semiconductor substrate;
an NMOS device comprising:
a first gate dielectric over the semiconductor substrate;
a first metal-containing gate electrode layer free from silicon therein over the first gate dielectric;
a silicon-containing layer over and contacting the first metal-containing gate electrode layer; and
a first contact etch stop layer having a first portion directly over the silicon-containing layer; and
a PMOS device comprising:
a second gate dielectric over the semiconductor substrate;
an adhesion layer over the second gate dielectric, wherein the adhesion layer comprises TiN, TaN, or TiSiN;
a second metal-containing gate electrode layer free from silicon therein over the adhesion layer; and
a second contact etch stop layer having a second portion directly over and contacting the second metal-containing gate electrode layer.

16. The semiconductor structure of claim 15, wherein the silicon-containing layer comprises a polysilicon layer, and a silicide layer over the polysilicon layer.

17. The semiconductor structure of claim 15, wherein the second metal-containing gate electrode layer comprises:
an adhesion layer; and
a metallic region, wherein the adhesion layer comprises a bottom portion underlying the metallic region, and a sidewall portion on a sidewall of the metallic region.

18. The semiconductor structure of claim 15, wherein the adhesion layer comprises TiN.

19. The semiconductor structure of claim 15, wherein a top surface of the first metal-containing gate electrode layer is lower than a top surface of the second metal-containing gate electrode layer.

* * * * *